United States Patent
Pallinti et al.

(10) Patent No.: US 7,531,442 B2
(45) Date of Patent: May 12, 2009

(54) ELIMINATE IMC CRACKING IN POST WIREBONDED DIES: MACRO LEVEL STRESS REDUCTION BY MODIFYING DIELECTRIC/METAL FILM STACK IN BE LAYERS DURING CU/LOW-K PROCESSING

(75) Inventors: Jayanthi Pallinti, Santa Clara, CA (US); Dilip Vijay, Redwood City, CA (US); Hemanshu Bhatt, Vancouver, WA (US); Sey-Shing Sun, Portland, OR (US); Hong Ying, Cupertino, CA (US); Chiyi Kao, San Jose, CA (US); Peter Burke, Portland, OR (US); Ramaswamy Ranganathan, Saratoga, CA (US); Qwai Low, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 368 days.

(21) Appl. No.: 11/290,087

(22) Filed: Nov. 30, 2005

(65) Prior Publication Data

US 2007/0123024 A1     May 31, 2007

(51) Int. Cl.
    *H01L 21/44*     (2006.01)
(52) U.S. Cl. .................. 438/613; 438/614; 438/637; 438/666

(58) Field of Classification Search .................. 438/613, 438/614, 617, 618, 622, 629, 637, 638, 666, 438/668, 672, 675, 687
See application file for complete search history.

(56) References Cited

U.S. PATENT DOCUMENTS

| | | | |
|---|---|---|---|
| 6,703,286 B1 * | 3/2004 | Yu et al. | 438/401 |
| 6,815,346 B2 * | 11/2004 | Davis et al. | 438/666 |
| 7,098,544 B2 * | 8/2006 | Edelstein et al. | 257/788 |
| 7,271,093 B2 * | 9/2007 | Loke et al. | 438/671 |
| 2006/0091536 A1 * | 5/2006 | Huang et al. | 257/734 |

* cited by examiner

*Primary Examiner*—Kevin M Picardat
(74) *Attorney, Agent, or Firm*—Trexler, Bushnell, Giangiorgi & Blackstone Ltd.

(57) ABSTRACT

Different ways to reduce or eliminate the IMC cracking issues in wire bonded parts, including: changing to more compressive dielectric films for top, R1, and R2; changing the top passivation film stacks to more compressive films; changing the low k film to a higher compressive film; reducing the R layer thickness and pattern density to reduce tensile stress; and minimizing anneal and dielectric deposition temperatures. Each of the methods can be used individually or in combination with each other to reduce overall tensile stresses in the Cu/low-k wafer thus reducing or eliminating the IMC cracking issue currently seen in the post wire bonded parts.

4 Claims, 3 Drawing Sheets

ELIMINATE IMC CRACKING IN POST WIREBONDED DIES: MACRO LEVEL STRESS REDUCTION BY MODIFYING DIELECTRIC/METAL FILM STACK IN BE LAYERS DURING CU/LOW-K PROCESSING

BACKGROUND

The present invention generally relates to dielectric/metal film stacks, and more specifically relates to eliminating IMC cracking in post wirebonded dies.

It has been observed that some post wire bonded dies that have undergone Cu/Low-K metallization show signature of 'open' fails after several hours of HTS (high temperature storage). Failure analysis on such parts shows cracks at the interface of intermetallic compound (IMC) and gold bond. FIG. 1 shows an X-SEM of a bonded die with IMC cracking.

Historically, IMC cracking in Au—Al wirebonds have been attributed to several causes including contamination on the surface of the Al-pads, incompatible film properties of the Al-films, presence of halides in the molding compounds, excessive levels of voids in the molding compounds and poorly optimized bonding and molding conditions. However, in the case of wire bond devices with Cu/Low-k metallization, the cracking of IMC persists despite careful control of the above-mentioned factors. Through a cumulative set of deductive experiments and use advanced analytical techniques, it has been determined that the cracking of IMC wire bond devices with Cu/Low-k metallization is a strong function of the tensile stresses in the film. It has been found that the unusually high tensile stresses generated in the Cu/Low-K stacks can drive excessive diffusion of Al into the Au bonds leading to very thick and Al-rich IMC phases. The unstable Al-rich phases eventually undergo reverse phase transformations to Au-rich phases; the associated volume change (very large~30%) in such phase transformations can result in voiding and eventual cracking of the IMC. The way to prevent this issue then is to tailor the stresses in the Cu/Low-K stacks so that the Al-diffusion rates are controlled to a low enough level that the stable Au-rich phases are formed preferably when compared to Al-rich phases. This will prevent any tendencies for phase transformation in the system.

Stress Build-Up:

The present invention addresses the stress related issues that cause the IMC cracking and methods to eliminate the IMC cracking by controlling the macro stresses in the wafer. During Cu/Low-k processing, it has been found that there is cumulative stress buildup in wafers due to intrinsic stresses in metal and dielectric films and due to various thermal cycles. Thermal stresses are generated due to a mismatch between the temperature coefficients of expansion between metal, dielectric films and substrate, as illustrated in the following table:

| Material | Coefficient of thermal expansion for various film (per degree Celsius) |
| --- | --- |
| Al | 2.2E–05 |
| Cu | 1.7E–05 |
| Ti/TiN | 9.0E–06 |
| Ta/TaN | 6.0E–06 |
| Si | 3.0E–06 |
| SiO$_2$ | 5.5E–07 |

Intrinsic stresses are generated during deposition. The stress state can be evaluated with freestanding films (or films on flexible substrates). Some general observations regarding stresses in thin films is provided below for reference:

1. Tensile: typically, an upward curve is generated due to repulsive forces between tapered grains in zone 1 structure formed by evaporation or sputtering with high pressure and low power.
2. Compressive: typically, a downward curve is generated due to atomic peening of crystal grains by reflected neutrals during sputtering.
3. Metals with Body Centered Cubic (BCC) structure, e.g., W, Ta (mostly refractory metals), can have extremely high compressive stress due to open lattice that allows atoms to be easily displaced.
4. Metals with Face Centered Cubic (FCC) structure, e.g., Cu, Al and Au (most noble metals), have very little intrinsic stress (low re-crystallization temperature).
5. Dielectric (CVD) films can be tensile or compressive depending on deposition parameters, e.g., temperature and plasma power.

The macro stresses in the wafer can be measured by measuring the bow in the wafer and translating the values to stresses through Poisson's equations. In general, a positive wafer gap during the wafer bow measurement indicates tensile stresses in the wafers and a negative wafer gap indicates compressive stresses. FIG. 2 shows a normalized graph with stress accumulated on a wafer at various stages in the BEOL Cu/Low-k wafer processing.

It is evident from FIG. 2 that the tensile stresses on the wafer keep increasing in the wafer as more and more metallization steps are added to the film and the wafer experiences maximum tensile stress during deposition of the Aluminum pad. Aluminum and copper are known to contribute to tensile stresses, while the dielectric films can contribute to tensile or compressive stresses based on deposition conditions like temperature, time, etc. As the tensile stresses in the wafer build-up, the wafer can bow due to the warpage or macro stress distributions from the center to the edge of the wafer. However, the local stress distribution in the Aluminum pads is harder to characterize.

OBJECT AND SUMMARY

An object of an embodiment of the present invention is to reduce the macro stress of the Cu BE stack in order to reduce or eliminate the IMC cracking issues in wire bonded parts during temperature cycling.

Briefly, and in accordance with at least one of the foregoing objects, the present invention provides different ways to reduce or eliminate the IMC cracking issues in wire bonded parts. The different ways include: changing to more compressive dielectric films for top, R1, and R2; changing the top passivation film stacks to more compressive films; changing the low k film to a higher compressive film; reducing the R layer thickness and pattern density to reduce tensile stress; and minimizing anneal and dielectric deposition temperatures. All of the methods described above can be used individually or in combination with each other to reduce overall tensile stresses in the Cu/low-k wafer thus reducing or eliminating the IMC cracking issue currently seen in the post wire bonded parts.

BRIEF DESCRIPTION OF THE DRAWINGS

The organization and manner of the structure and operation of the invention, together with further objects and advantages thereof, may best be understood by reference to the following description, taken in connection with the accompanying drawing, wherein.

DESCRIPTION

Figure 1:
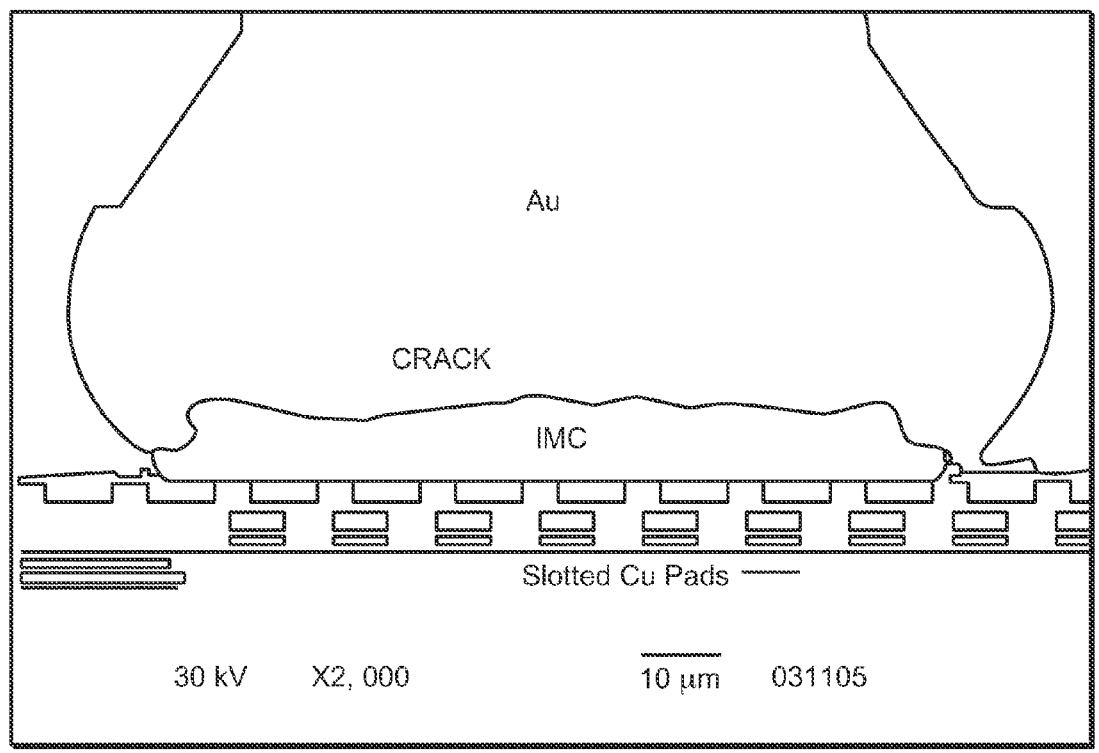
FIG. 1 shows an X-SEM of a bonded die with IMC cracking.
Figure 2:
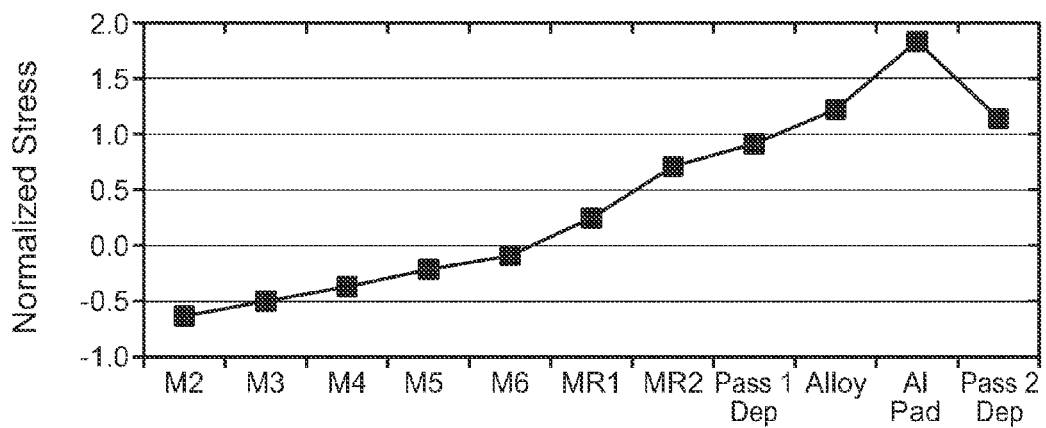
FIG. 2 shows a normalized graph with stress accumulated on a wafer at various stages in the BEOL Cu/low-k wafer processing.

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

Figure 3:
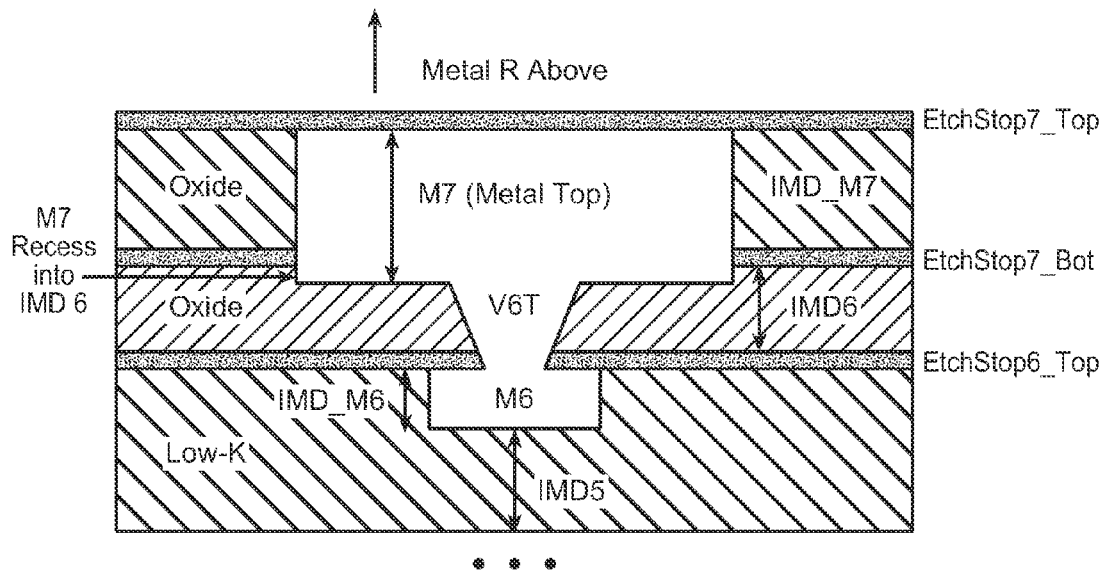
FIG. 3 provides a cross-sectional view showing the top via/thick metal (Oxide IMD, DD, with etch stop) for V6T/M7 in a 6+1+R1+R2 scheme.
Figure 4:
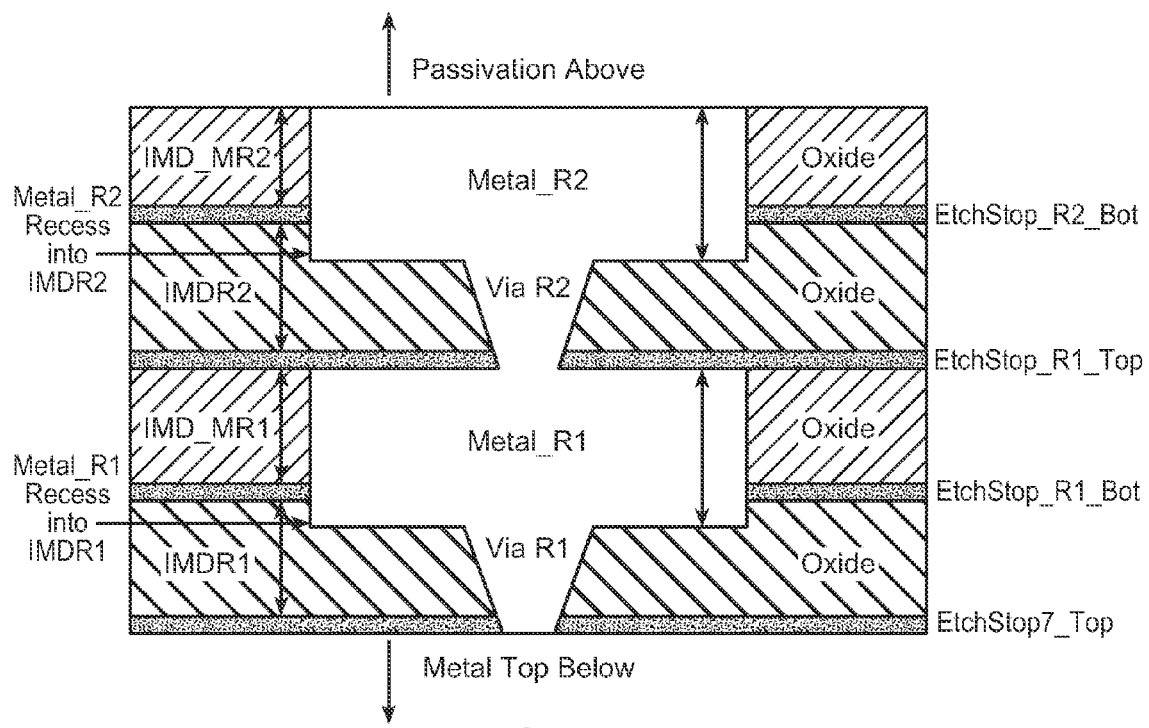
FIG. 4 provides a cross-sectional view showing the via R/Metal R layers (Oxide IMD, DD, with etch stop)
Figure 5:
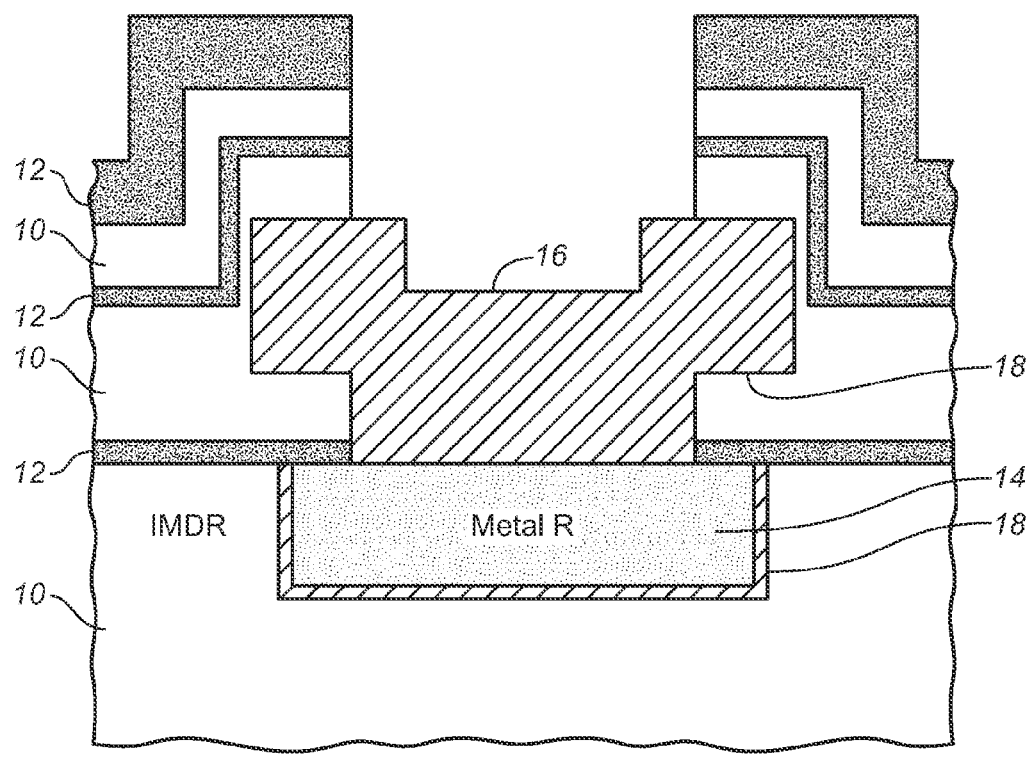
FIG. 5 provides a cross-sectional view showing passivation: 5-layer Oxide/Nitride stack.

FIG. 3 provides a cross-sectional view showing the top via/thick metal (Oxide IMD, DD, with etch stop) for V6T/M7 in a 6+1+R1+R2 scheme, and FIG. 4 shows the via R/Metal R layers. FIG. 5 provides a cross-sectional view showing passivation: 5-layer Oxide/Nitride stack (in FIG. 5, reference numeral 10 identifies Oxide layers (i.e., $SiO_2$), reference numeral 12 identifies Nitride layers (i.e., SiN), reference numeral 14 identifies Copper layers, reference numeral 16 identifies an Aluminum layer, and reference numeral 18 identifies layers of TaN. FIGS. 3-5 are referenced below in connection with describing embodiments of the present invention.

The present disclosure includes a list of various methods to reduce the macro stress of the Cu BE stack in order to reduce or eliminate the IMC cracking issues in wire bonded parts during temperature cycling. The different methods are set forth below and may be used separately or in combination.

1. Change to more compressive dielectric films for top (see FIG. 3), R1 (see FIG. 4), and R2 (see FIG. 4):

Currently in the industry, the dielectric films used in the top metal, and redistribution layers are different kinds of undoped oxides (USG). These layers are normally thicker (7000 KÅ to 1.2 μm) in comparison to thin intermediate metal layers (which are about 3000 Å thick). Use of dielectric films with higher compressive stress at these metal layers will reduce the overall cumulative tensile stress in the wafer. For e.g., TEOS films are more compressive than Silane oxides and also reducing the deposition temperature of the films can increase the compressive stress. Typically in the industry, a Silane oxide is used which has a compression value of −1.06 E9. The present invention provides using a more compressive material, such as a material having a compressive value greater than −2.7 E9. For example, TEOS can be used.

2. Change the top passivation film stacks (see FIG. 5) to more compressive films.

Figure 6:
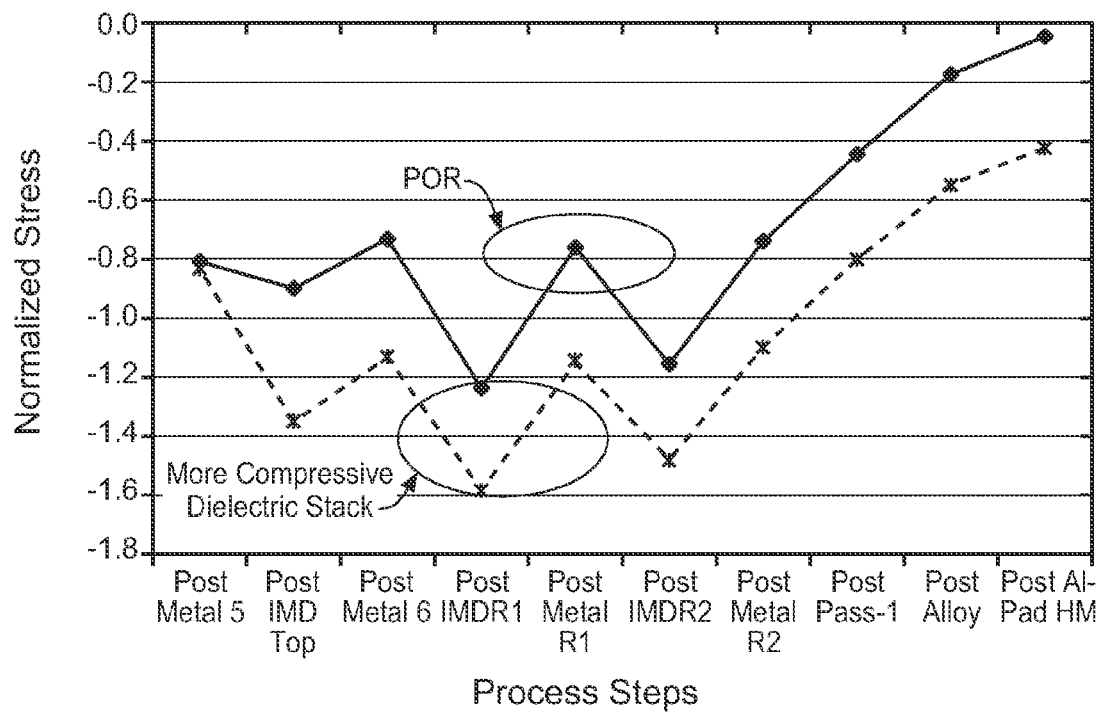
FIG. 6 is a graph which shows the normalized stress change associated with a change in the dielectric stack to more compressive films in the passivation layer.

Passivation films used after metallization are typically a combination of TEOS, and SiN. SiN is a more compressive film than TEOS. Modification of film stacks to include thicker dielectric with high compressive stress can reduce the overall tensile stress in the wafer. Normalized stress data with changing compressive films is shown in FIG. 6. Typically in the industry, a combination of TEOS and SiN is used at a thickness of 7000 Å, and having a compression value of −1.06 E9. The present invention provides using a thicker, more compressive dielectric, such as a dielectric having a thickness of at least 8000 Å and a compression value of at least −2.7 E9. For example, SiN can be used at the specified thickness and to provide the specified compressive value.

3. Change low k to a higher compressive film (see FIG. 3).

The intermediate thin metal layers typically are coupled with low-k dielectric films. Choice of low-k films with higher compressive stress can act advantageous to decrease the overall tensile stress in the wafer. Typically, a Silane oxide is used which has a compression value of −1.06 E9. The present invention provides using a more compressive, low-k material, such as a material having a compressive value of at least −2.7 E9. For example, TEOS can be used.

4. Reduce R layer thickness (see FIG. 4) and pattern density to reduce tensile stress.

Copper metal contributes to the high tensile stress because of its film property. The metal redistribution layers are typically very thick (typically 1-1.5 μm, such as 1 μm) and have high density (typically 60%-80% density). Redesigning the metal layers to decrease the thickness of copper in redistribution layers along with decreasing the metal density can greatly improve the tensile stress accumulation in the wafer. The present invention provides having the layer be thicker, such as at least 8000 Å, and using a denser material such as a material having a density of 50%. For example, TEOS can be used.

5. Minimize anneal and dielectric deposition temperatures

It is known that higher dielectric deposition temperatures results in lower compressive stresses. Hence, decreasing dielectric deposition temperatures, for example, from 400 degrees Celsius to 350 degrees Celsius for TEOS or silane films can reduce the overall tensile film in the wafer.

Wafers typically are subjected to high temperature anneal after Aluminum pad deposition. Lowering the anneal temperature from 400 degrees Celsius to 300 degrees Celsius can cause an enormous difference in the overall tensile stress in the wafer.

All of the methods described above can be used individually or in combination with each other to reduce overall tensile stresses in the Cu/low-k wafer thus reducing or eliminating the IMC cracking issue currently seen in the post wire bonded parts.

While embodiments of the present invention are shown and described, it is envisioned that those skilled in the art may devise various modifications of the present invention without departing from the spirit and scope of the appended claims.

What is claimed is:

1. A method for reducing or eliminating IMC cracking issues in wire bonded parts, said method comprising at least one of the following: using a material having a compressive value greater than −2.7 E9 for at least one of the top, R1, and R2 layers; using a low K film having a compressive value of at least −2.7 E9; using for the R layer, a material which has a thickness of at least 8000 Å and has a density of at least 50%; using a deposition temperature of no more than 350 degrees Celsius for TEOS or silane films, and using an anneal temperature of no more than 300 degrees Celsius.

2. A method as recited in claim 1, wherein the step of using a material having a compressive value greater than −2.7 E9 for at least one of the top, R1 and R2 layers comprises using TEOS.

3. A method as recited in claim 1, wherein the step of using a low K film having a compressive value of at least −2.7 E9 comprises using TEOS.

4. A method as recited in claim 1, wherein the step of using for the R layer, a material which has a thickness of at least 8000 Å and has a density of at least 50%, comprises using TEOS.

* * * * *